United States Patent
Chang

(10) Patent No.: US 9,684,626 B2
(45) Date of Patent: Jun. 20, 2017

(54) WIRELESS TRANSMISSION AND VIDEO INTEGRATED APPARATUS

(71) Applicant: Nai-Chien Chang, New Taipei (TW)

(72) Inventor: Nai-Chien Chang, New Taipei (TW)

(*) Notice: Subject to any disclaimer, the term of this patent is extended or adjusted under 35 U.S.C. 154(b) by 182 days.

(21) Appl. No.: 14/747,337

(22) Filed: Jun. 23, 2015

(65) Prior Publication Data
US 2016/0004662 A1 Jan. 7, 2016

(30) Foreign Application Priority Data
Jul. 2, 2014 (TW) .............................. 103211761 U

(51) Int. Cl.
| | |
|---|---|
| *G06F 13/42* | (2006.01) |
| *G06F 13/40* | (2006.01) |
| *G06F 1/16* | (2006.01) |
| *H05K 1/14* | (2006.01) |
| *H05K 3/34* | (2006.01) |

(52) U.S. Cl.
CPC ........ *G06F 13/4282* (2013.01); *G06F 1/1626* (2013.01); *G06F 1/1684* (2013.01); *G06F 1/1686* (2013.01); *G06F 1/1698* (2013.01); *G06F 13/4022* (2013.01); *G06F 13/4068* (2013.01); *H05K 1/14* (2013.01); *H05K 1/141* (2013.01); *H05K 1/144* (2013.01); *H05K 3/3447* (2013.01); *G06F 2200/1635* (2013.01); *H01L 2224/16* (2013.01); *H01L 2224/73253* (2013.01); *H01L 2924/14* (2013.01); *H05K 2201/041* (2013.01)

(58) Field of Classification Search
None
See application file for complete search history.

(56) References Cited

U.S. PATENT DOCUMENTS

| | | | |
|---|---|---|---|
| 8,497,866 B2 * | 7/2013 | Daniel | ...................... G06F 3/14 |
| | | | 345/520 |
| 9,332,295 B2 * | 5/2016 | Chang | ...................... H01L 24/00 |

(Continued)

OTHER PUBLICATIONS

'IoT Security Camera' by Mario Cannistra, hackster.io, Jul. 26, 2015.*

*Primary Examiner* — Steven Snyder
(74) *Attorney, Agent, or Firm* — Chun-Ming Shih; HDLS IPR Services

(57) ABSTRACT

A wireless transmission and video integrated apparatus includes a hub module, a video module and a wireless module. The hub module includes a hub unit, a first expansion interface, a second expansion interface and a transmission interface. The video module includes a first connection interface, an image processing unit, an image acquisition unit and a microphone unit. The video module is electrically connected to the first expansion interface of the hub module through the first connection interface. The wireless module includes a second connection interface, a wireless communication unit and an antenna unit. The wireless module is electrically connected to the second expansion interface of the hub module through the second connection interface. The video module and the wireless module are integrated as a whole through the hub module, and then electrically connected to an electronic apparatus through the transmission interface to help with the assembly.

13 Claims, 9 Drawing Sheets

(56) References Cited

U.S. PATENT DOCUMENTS

| | | | | |
|---|---|---|---|---|
| 2004/0267419 | A1* | 12/2004 | Jeng | B60R 1/12 701/36 |
| 2006/0288139 | A1* | 12/2006 | Lee | G06F 1/16 710/62 |
| 2014/0257591 | A1* | 9/2014 | Cheng | G05D 7/0676 700/300 |
| 2014/0260704 | A1* | 9/2014 | Lloyd | B81C 1/0023 73/865.8 |
| 2014/0321039 | A1* | 10/2014 | Quijano | G06F 1/1601 361/679.22 |
| 2016/0007068 | A1* | 1/2016 | Chang | H01L 24/00 348/207.1 |
| 2016/0170931 | A1* | 6/2016 | Quach | G06F 13/4022 710/313 |
| 2016/0275036 | A1* | 9/2016 | Chew | G06F 13/4081 |

* cited by examiner

WIRELESS TRANSMISSION AND VIDEO INTEGRATED APPARATUS

BACKGROUND OF THE INVENTION

Field of the Invention

The present invention relates to an integrated apparatus, and especially relates to a wireless transmission and video integrated apparatus.

Description of the Related Art

Nowadays, electronic apparatuses, such as notebook computers, tablet computers or smart phones, usually have a lot of function modules to meet users' requirements. For examples, the video function and the surfing internet function are the two most frequently used functions that common users use. Therefore, current electronic apparatuses usually have built-in function modules in accordance with the two functions mentioned above.

To take the notebook computer as an example, a video module providing the video function is usually arranged at the upper border of the monitor of the notebook computer, and the video module is then connected to a main board through a cable. Moreover, an internet processing chip providing the surfing internet function is usually arranged on the main board of the notebook computer, and an antenna is arranged at one of the borders of the monitor, and then the antenna is connected to the internet processing chip on the main board through a cable to obtain better internet quality.

As mentioned above, current electronic apparatuses have the video function and the surfing internet function. However, the video module, the internet processing chip and the antenna mentioned above are manufactured respectively and are assembled to the electronic apparatus respectively, and then are connected to each other through cables. Therefore, manufacturing and assembling the electronic apparatus spends a lot of time in the production line.

In order to solve the above-mentioned problems, a new integrated module integrating the video module, the internet processing chip and the antenna mentioned above are provided to save manufacturing and assembling time.

However, manufacturing and selling a new module which is related to the internet processing function usually needs the certification from the relative organization. Therefore, the manufacturer manufacturing and selling the new module mentioned above costs a lot of certification fee. Moreover, if the internet processing chip mentioned above is a Wi-Fi chip or a Bluetooth chip, the manufacturer manufacturing and selling the new module having Wi-Fi function or Bluetooth function even costs more certification fee because the Wi-Fi protocol and the Bluetooth protocol are complex and have higher certification fee.

SUMMARY OF THE INVENTION

The main object of the present invention is to provide a wireless transmission and video integrated apparatus that integrates the video module and the wireless module by the expansion method to save manufacturing time and process, wherein the video module and the wireless module are manufactured and assembled to the electronic apparatus respectively for the conventional electronic apparatus. In the meantime, the manufacturer does not need to manufacture the new module integrating the functions mentioned above.

In order to achieve the object mentioned above, the wireless transmission and video integrated apparatus of the present invention comprises a hub module, a video module and a wireless module. The hub module comprises a hub unit, a first expansion interface, a second expansion interface and a transmission interface. The video module comprises a first connection interface, an image processing unit, an image acquisition unit and a microphone unit. The video module is electrically connected to the first expansion interface of the hub module through the first connection interface. The wireless module comprises a second connection interface, a wireless communication unit and an antenna unit. The wireless module is electrically connected to the second expansion interface of the hub module through the second connection interface.

Comparing to the prior art, the advantage of the present invention is that the video module and the wireless module are integrated as a whole through the hub module, and then are electrically connected to the electronic apparatus through the transmission interface, so that assembling the wireless transmission and video integrated apparatus of the present invention into the electronic apparatus is quick and convenient.

Moreover, because the hub module of the present invention is connected to the wireless module by the expansion method, the wireless module already existing and having the certification can be used directly. Therefore, the certification fee for the new module mentioned above is saved.

DETAILED DESCRIPTION OF THE INVENTION

Please refer to following description and figures for the detailed features and technical contents of the present invention. However, the following description and figures are referred for the present invention, but the present invention is not limited to it.

Figure 1:
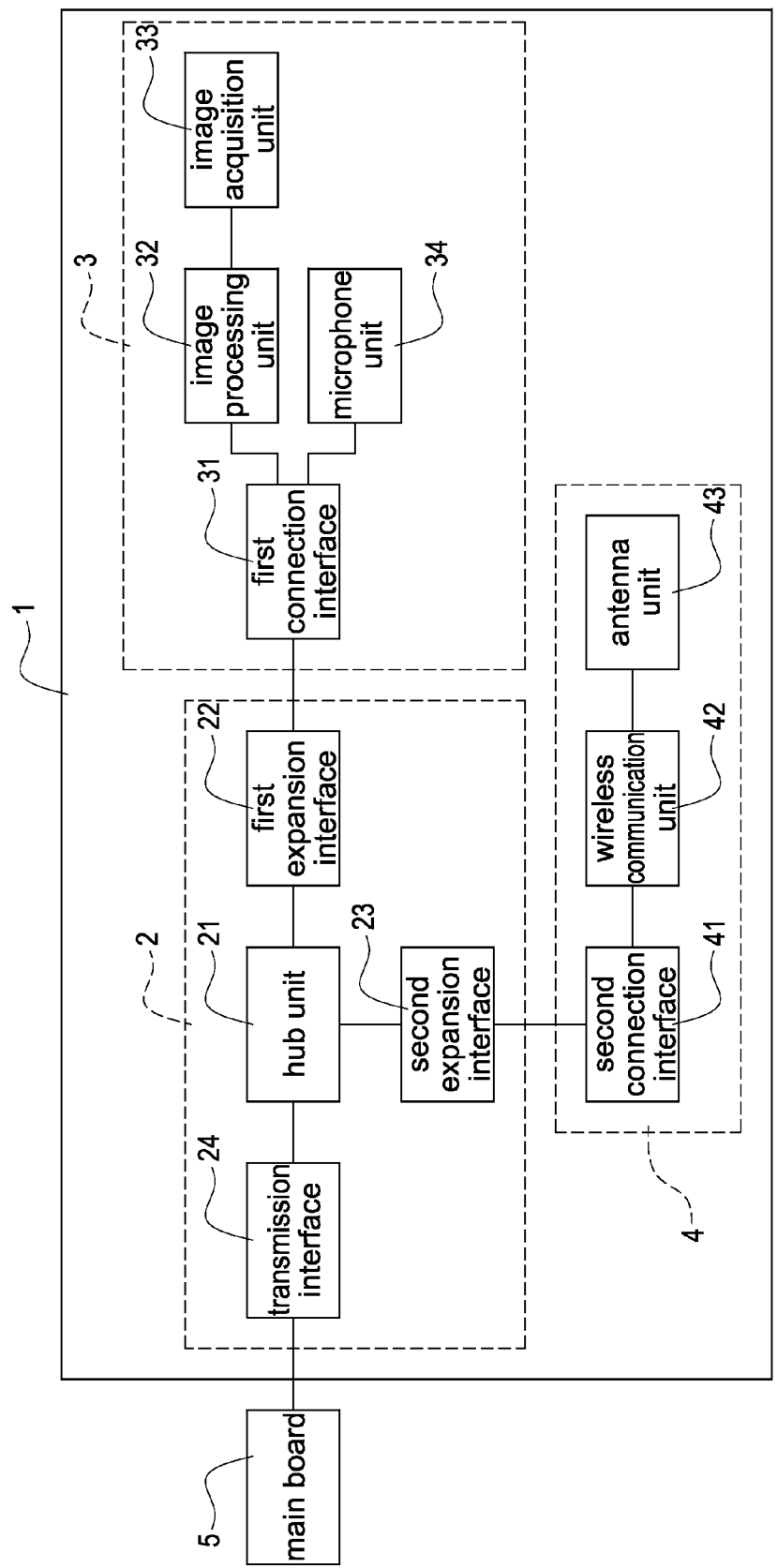
FIG. 1 shows a block diagram of the first embodiment of the present invention.
Figure 2:
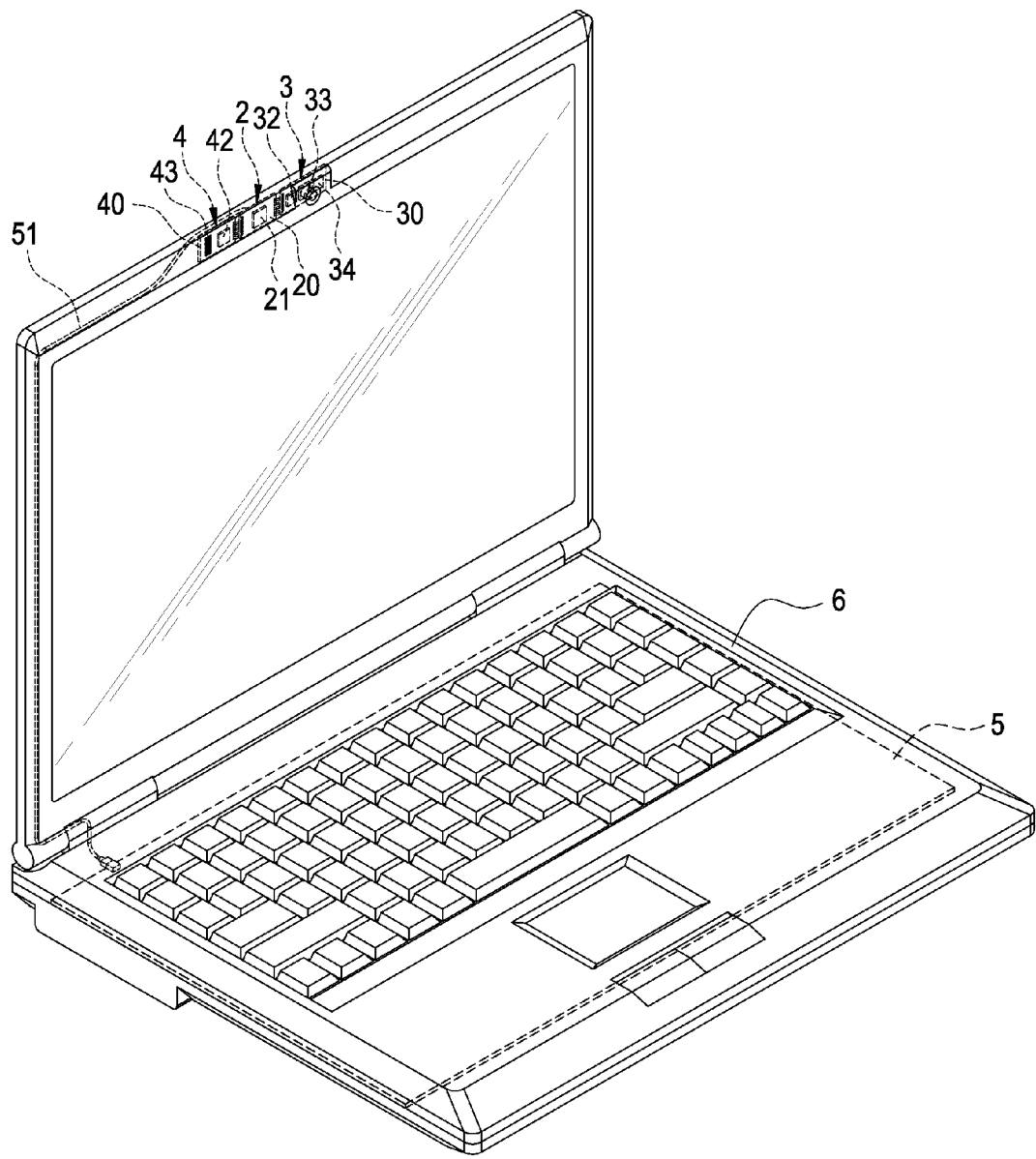
FIG. 2 shows a connection diagram of the first embodiment of the present invention.

FIG. 1 shows a block diagram of the first embodiment of the present invention. FIG. 2 shows a connection diagram of the first embodiment of the present invention. As shown in FIG. 1 and FIG. 2, the present invention provides a wireless transmission and video integrated apparatus 1. The wireless transmission and video integrated apparatus 1 comprises a hub module 2, a video module 3 and a wireless module 4.

The hub module 2 mainly comprises a hub circuit board 20, a hub unit 21 a first expansion interface 22, a second expansion interface 23 and a transmission interface 24. The hub circuit board 20 is electrically connected to the hub unit 21, the first expansion interface 22, the second expansion interface 23 and the transmission interface 24. The hub circuit board 20 is mainly made of hard glass fibers or soft thin films. The hub unit 21 is, for example but not limited to, a hub integrated circuit (IC).

The hub unit 21 is electrically connected to the first expansion interface 22, the second expansion interface 23 and the transmission interface 24 through the hub circuit board 20, so that modules (namely, the video module 3 and the wireless module 4) connected to the first expansion interface 22 and the second expansion interface 23 are integrated. The hub unit 21 is electrically connected to (or outputs to) a main board 5 of an external electronic apparatus (for example, a computer 6 shown in FIG. 2). In this embodiment, the hub unit 21 is connected to the video module 3 through the first expansion interface 22, and is connected to the wireless module 4 through the second expansion interface 23.

Specifically, the transmission interface 24 is electrically connected to a transmission line 51 and is electrically connected to the main board 5 through the transmission line 51. In this embodiment, the transmission interface 24 is a plurality of connection points. One side of the transmission line 51 is welded and connected directly to the connection points. The other side of the transmission line 51 is electrically connected to the main board 5. In other embodiments, the transmission interface 24 is, for examples but not limited to, a connector or a cable socket to be electrically connected to a connector or a cable plug at one side of the transmission line 51.

The video module 3 mainly comprises a first circuit board 30, a first connection interface 31, an image processing unit 32, an image acquisition unit 33 and a microphone unit 34. The first circuit board 30 is electrically connected to the first connection interface 31, the image processing unit 32, the image acquisition unit 33 and the microphone unit 34. In this embodiment, the image acquisition unit 33 is, for example, a charge-coupled device (CCD) or a complementary metal-oxide semiconductor (CMOS) camera lens for acquiring external image signals.

The image processing unit 32 is electrically connected to the image acquisition unit 33. The image processing unit 32 processes the image signals outputted from the image acquisition unit 33 with an analog-to-digital conversion to obtain a converted image signal and then outputs the converted image signal. Moreover, the converted image signal can be amplified by an amplifying circuit (not shown in FIG. 1 or FIG. 2) before being outputted from the image processing unit 32. According to the requirement, a plurality of the image acquisition units 33 can be arranged, so that the computer 6 shown in FIG. 2 can take 3D pictures or videos through these image acquisition units 33. Moreover, going with the software, these image acquisition units 33 can be combined as a somatosensory input unit.

The image processing unit 32 is electrically connected to the first connection interface 31. The video module 3 is electrically connected to the first expansion interface 22 of the hub module 2 through the first connection interface 31. Therefore, the converted image signal is sent from the image processing unit 32 to the hub module 2.

The microphone unit 34 is electrically connected to the first connection interface 31. The microphone unit 34 receives external audio signals and sends the external audio signals to the hub module 2 through the first connection interface 31.

The wireless module 4 mainly comprises a second circuit board 40, a second connection interface 41, a wireless communication unit 42 and an antenna unit 43. The second circuit board 40 is electrically connected to the second connection interface 41, the wireless communication unit 42 and the antenna unit 43. The antenna unit 43 is, for examples, an IC antenna or a planar inverted-F antenna (PIFA). Moreover, when the second circuit board 40 is processed with the surface line printing, the patterns of the antenna unit 43 can be printed on the second circuit board 40 to form the antenna unit 43 on the second circuit board 40 directly.

The wireless communication unit 42 is electrically connected to the antenna unit 43. When the antenna unit 43 receives a wireless signal, the antenna unit 43 sends the wireless signal to the wireless communication unit 42. The wireless communication unit 42 processes the wireless signal to obtain a processed signal. The wireless communication unit 42 is electrically connected to the second connection interface 41. The wireless module 4 is electrically connected to the second expansion interface 23 of the hub module 2 through the second connection interface 41. Therefore, the wireless communication unit 42 outputs the processed signal to the hub module 2 through the second connection interface 41.

In this embodiment, the wireless communication unit 42 is, for examples but not limited to, a Wi-Fi communication unit, a Bluetooth communication unit, a near field communication (NFC) communication unit, a radio frequency (RF) communication unit, a Zigbee communication unit, a global positioning system (GPS) communication unit or an infrared communication unit etc. In the present invention, according to the requirement of the manufacturer, the wireless module 4 with different types or designed by different manufacturers can be connected to the second expansion interface 23 of the hub module 2 by the expansion method to form different types of the wireless transmission and video integrated apparatus 1. It is convenient.

The hub module 2 is electrically connected to the video module 3 through the first expansion interface 22, and is electrically connected to the wireless module 4 through the second expansion interface 23, so that the hub module 2, the video module 3 and the wireless module 4 are integrated as a whole. The hub module 2 respectively processes the video signal and the audio signal sent from the video module 3 through the hub unit 21, and processes the wireless signal sent from the wireless module 4, and then sends the signals mentioned above to the main board 5 for farther processes and applications.

As shown in FIG. 2, the wireless transmission and video integrated apparatus 1 of the present invention is deemed as one object and directly arranged in an electronic apparatus, such as arranged at the upper border of the monitor of the electronic apparatus 6 (computer), and then electrically connected to the main board 5 of the electronic apparatus 6 (computer) through the single transmission line 51. Therefore, the assembly time of the wireless transmission and video integrated apparatus 1 can be reduced greatly. Moreover, at the upper border of the monitor of the electronic apparatus 6 (computer), the video function and the audio function provided by the video module 3 are the best (namely, acquiring the best video signal and the best audio signal). The antenna unit 43 can provide the best wireless transmission quality.

Figure 3A:
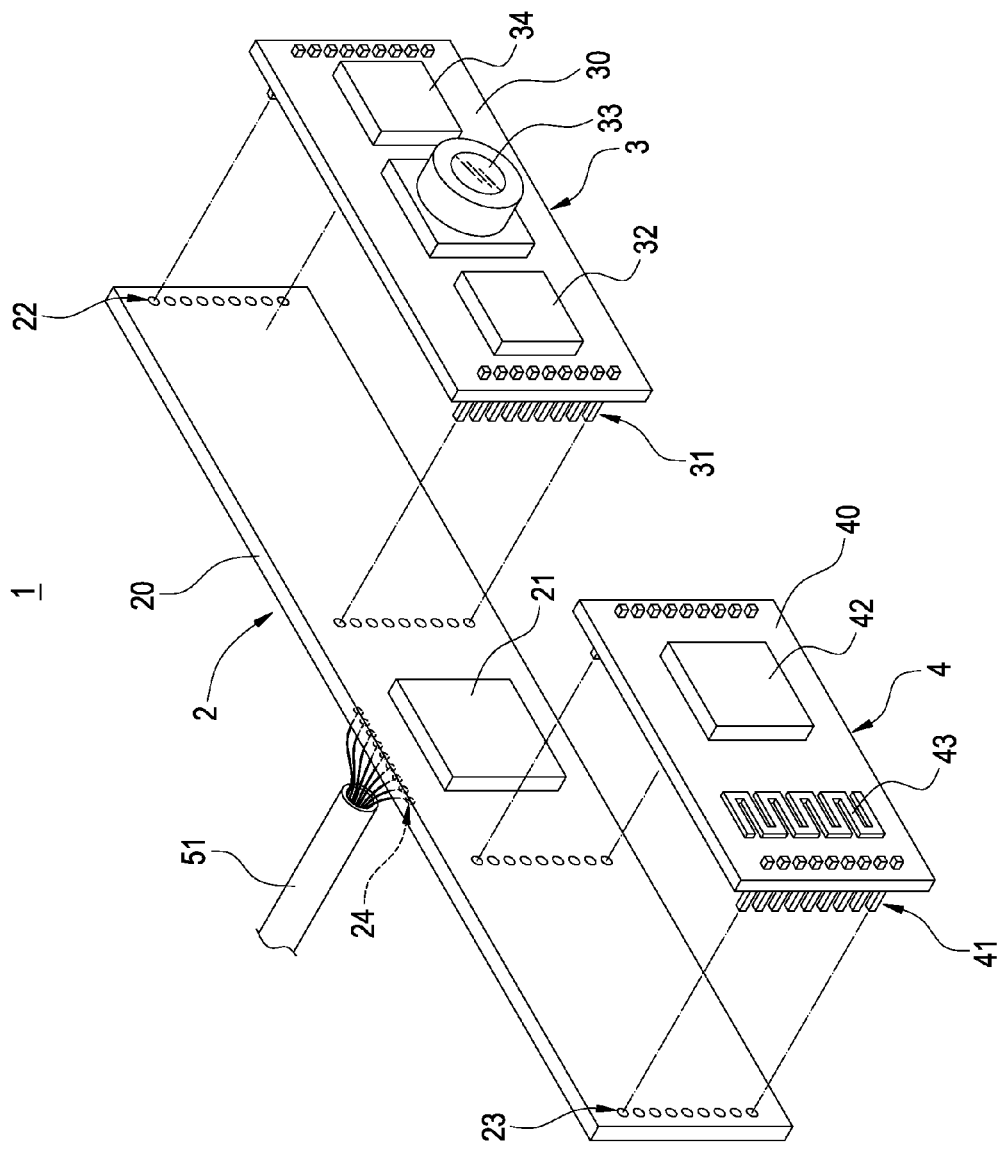
FIG. 3A shows an exploded view of the first embodiment of the present invention.
Figure 3B:
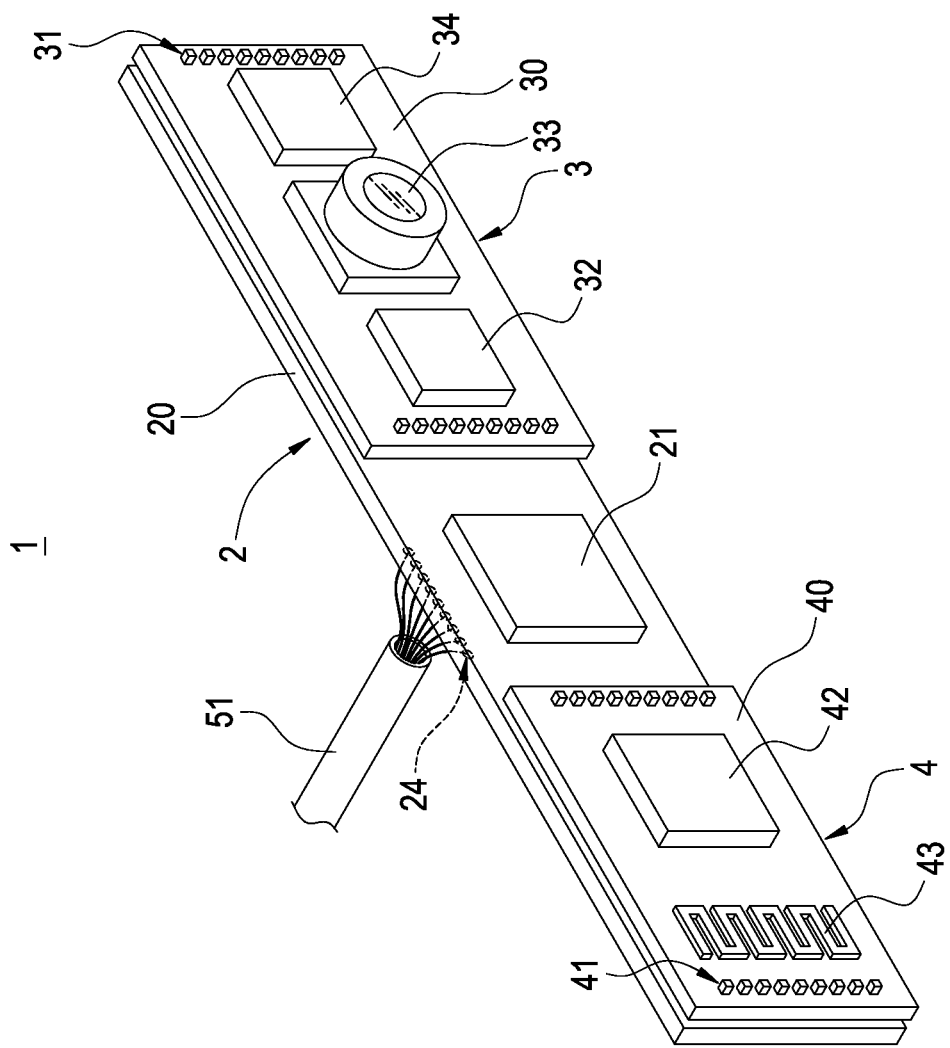
FIG. 3B shows an assembly drawing of the first embodiment of the present invention.

FIG. 3A shows an exploded view of the first embodiment of the present invention. FIG. 3B shows an assembly drawing of the first embodiment of the present invention. In this embodiment, the first expansion interface 22 and the second expansion interface 23 are a plurality of connection holes on the hub circuit board 20. The first connection interface 31 of the video module 3 comprises a plurality of connection pins, wherein one side of the connection pin is electrically connected to the first circuit board 30, and the other side of the connection pin plugs into the connection hole on the hub circuit board 20. Moreover, the second connection interface 41 of the wireless module 4 comprises a plurality of connection pins as well, wherein one side of the connection pin is electrically connected to the second circuit board 40, and the other side of the connection pin plugs into the connection hole on the hub circuit board 20.

As mentioned above, the video module 3 and the wireless module 4 respectively plug into the connection holes on the hub circuit board 20 through the first connection interface 31 and the second connection interface 41 to form the wireless transmission and video integrated apparatus 1. The wireless transmission and video integrated apparatus 1 further comprises a blocking element 10 covering the hub module 2, the video module 3 and the wireless module 4 to provide protecting from electromagnetic interference (EMI).

Figure 4A:
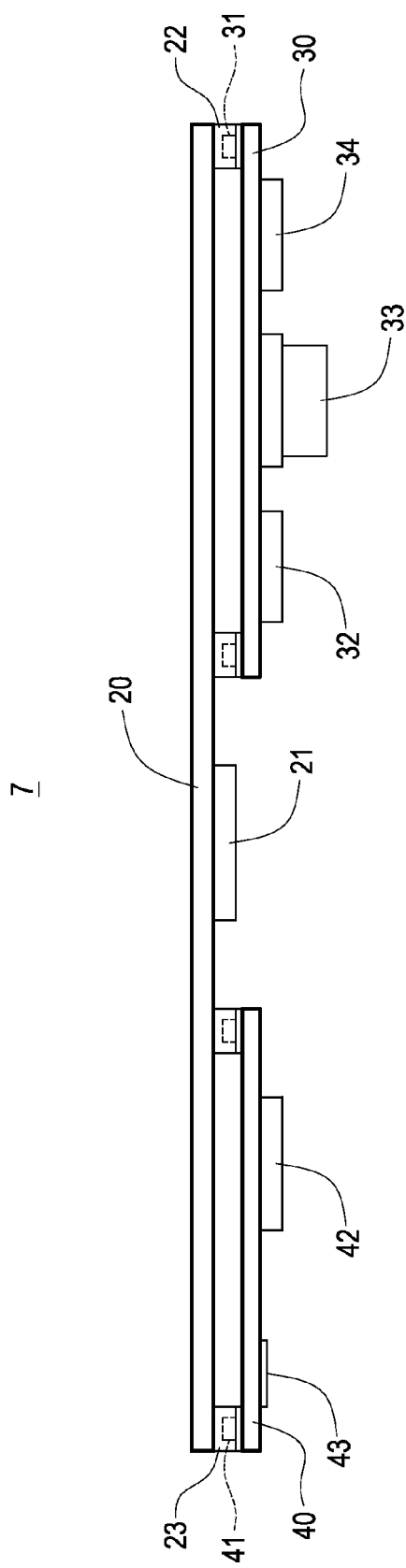
FIG. 4A shows an assembly drawing of the second embodiment of the present invention.
Figure 4B:
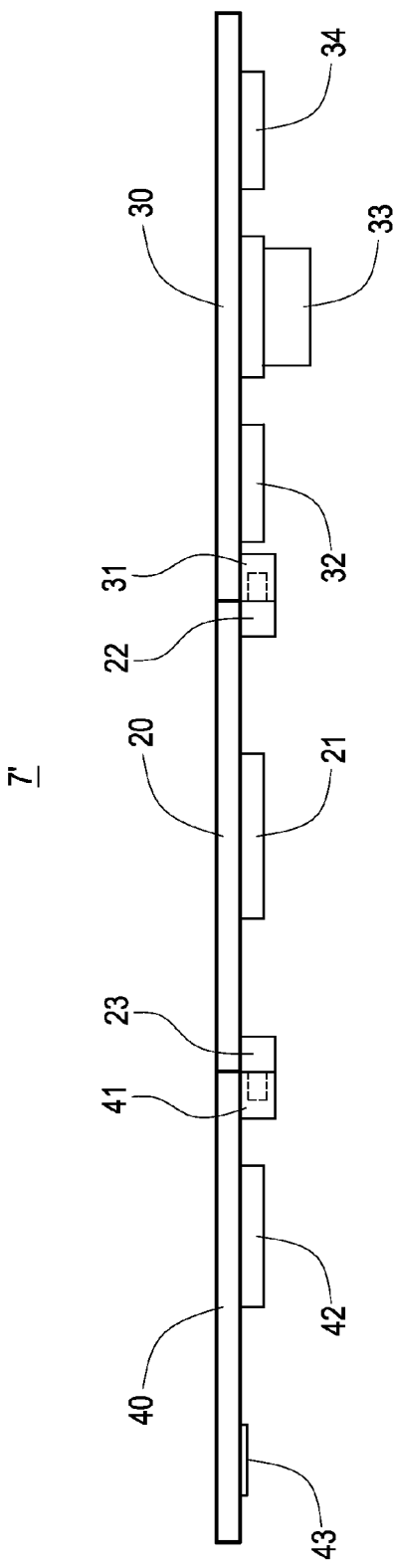
FIG. 4B shows an assembly drawing of the third embodiment of the present invention.

FIG. 4A shows an assembly drawing of the second embodiment of the present invention. FIG. 4B shows an assembly drawing of the third embodiment of the present invention. The embodiment shown in FIG. 4A discloses a second type of the wireless transmission and video integrated apparatus 7. The first expansion interface 22 and the second expansion interface 23 of the wireless transmission and video integrated apparatus 7 are butting connectors arranged on the hub circuit board 20. The connection ports of the first expansion interface 22 and the second expansion interface 23 are arranged vertically on an upper side (namely, the component side having the hub unit 21) of the hub circuit board 20.

The first connection interface 31 of the wireless transmission and video integrated apparatus 7 are butting connectors arranged vertically on the first circuit board 30 and matches the type, quantity and locations of the first expansion interface 22. The connection ports of the first connection interface 31 are arranged vertically on the lower side (namely, not the component side having the image processing unit 32, the image acquisition unit 33 and the microphone unit 34) of the first circuit board 30. Therefore, the video module 3 vertically (namely, longitudinally) plugs into the first expansion interface 22 of the hub module 2 through the first connection interface 31 to complete the connection.

The second connection interface 41 of the wireless transmission and video integrated apparatus 7 are butting connectors vertically arranged on the second circuit board 40 and matches the type, quantity and locations of the second expansion interface 23. The connection ports of the second connection interface 41 are arranged vertically on the lower side (namely, not the component side having the wireless communication unit 42 and the antenna unit 43) of the second circuit board 40. Therefore, the wireless module 4 vertically (namely, longitudinally) plugs into the second expansion interface 23 of the hub module 2 through the second connection interface 41 to complete the connection.

In this embodiment, the first expansion interface 22, the second expansion interface 23, the first connection interface 31 and the second connection interface 41 are butting connectors. In other embodiments, the first expansion interface 22, the second expansion interface 23, the first connection interface 31 and the second connection interface 41 are row needles or row needle sockets, wherein the row needle sockets are plugged by the row needles.

FIG. 4B discloses a third type of the wireless transmission and video integrated apparatus 7' which is similar to the wireless transmission and video integrated apparatus 7 shown in FIG. 4A. The first expansion interface 22, the second expansion interface 23, the first connection interface 31 and the second connection interface 41 of the wireless transmission and video integrated apparatus 7' are butting connectors as well, but the connection ports of the first expansion interface 22 and the second expansion interface 23 of the wireless transmission and video integrated apparatus 7' are arranged horizontally on the hub circuit board 20.

In this embodiment, the first connection interface 31 of the video module 3 is arranged horizontally on the first circuit board 30. The second connection interface 41 of the wireless module 4 is arranged horizontally on the second circuit board 40. Therefore, the video module 3 and the wireless module 4 horizontally plug into the hub module 2, so that the video module 3, the hub module 2 and the wireless module 4 are connected in cascade.

Figure 5:
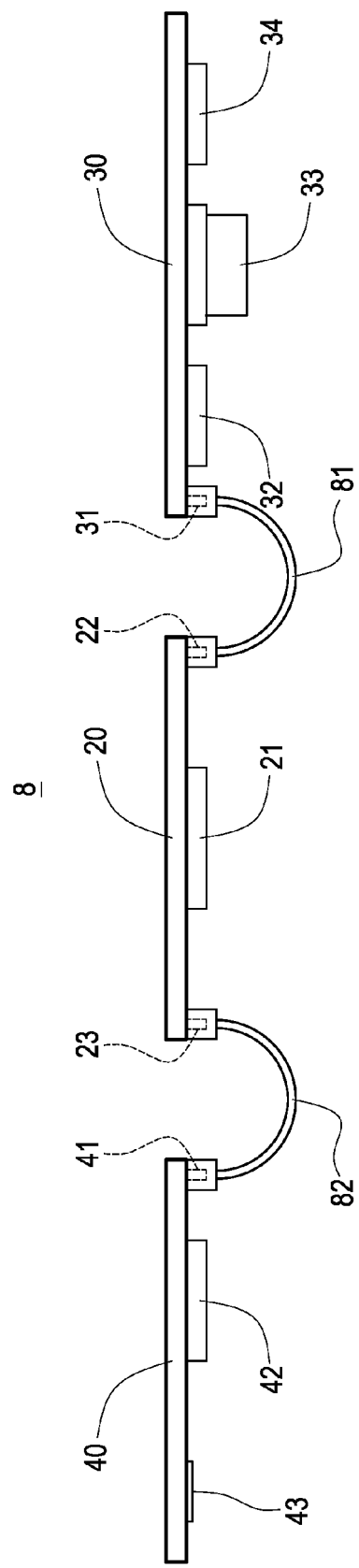
FIG. 5 shows an assembly drawing of the fourth embodiment of the present invention.

FIG. 5 shows an assembly drawing of the fourth embodiment of the present invention. FIG. 5 discloses a fourth type of the wireless transmission and video integrated apparatus 8. The first expansion interface 22 and the second expansion interface 23 of the wireless transmission and video integrated apparatus 8 are arranged on the hub circuit board 20 and are row needles or row needle sockets.

The first connection interface 31 of the wireless transmission and video integrated apparatus 8 is arranged on the first circuit board 30 and is row needles or row needle sockets. The quantity and the location of the first connection interface 31 matches the quantity and the location of the first expansion interface 22. The wireless transmission and video integrated apparatus 8 further comprises a first cable 81. Row needle sockets or row needles at one side of the first cable 81 are plugged by or plug into the first connection interface 31. Row needle sockets or row needles at the other side of the first cable 81 are plugged by or plug into the first expansion interface 22. Therefore, the video module 3 is connected to the hub module 2 through the first cable 81.

The second connection interface 41 of the wireless transmission and video integrated apparatus 8 is arranged on the second circuit board 40 and is row needles or row needle sockets. The quantity and the location of the second connection interface 41 matches the quantity and the location of the second expansion interface 23. The wireless transmission and video integrated apparatus 8 further comprises a second cable 82. Row needle sockets or row needles at one side of the second cable 82 are plugged by or plug into the second connection interface 41. Row needle sockets or row needles at the other side of the second cable 82 are plugged by or plug into the second expansion interface 23. Therefore, the wireless module 4 is connected to the hub module 2 through the second cable 82.

Figure 6:
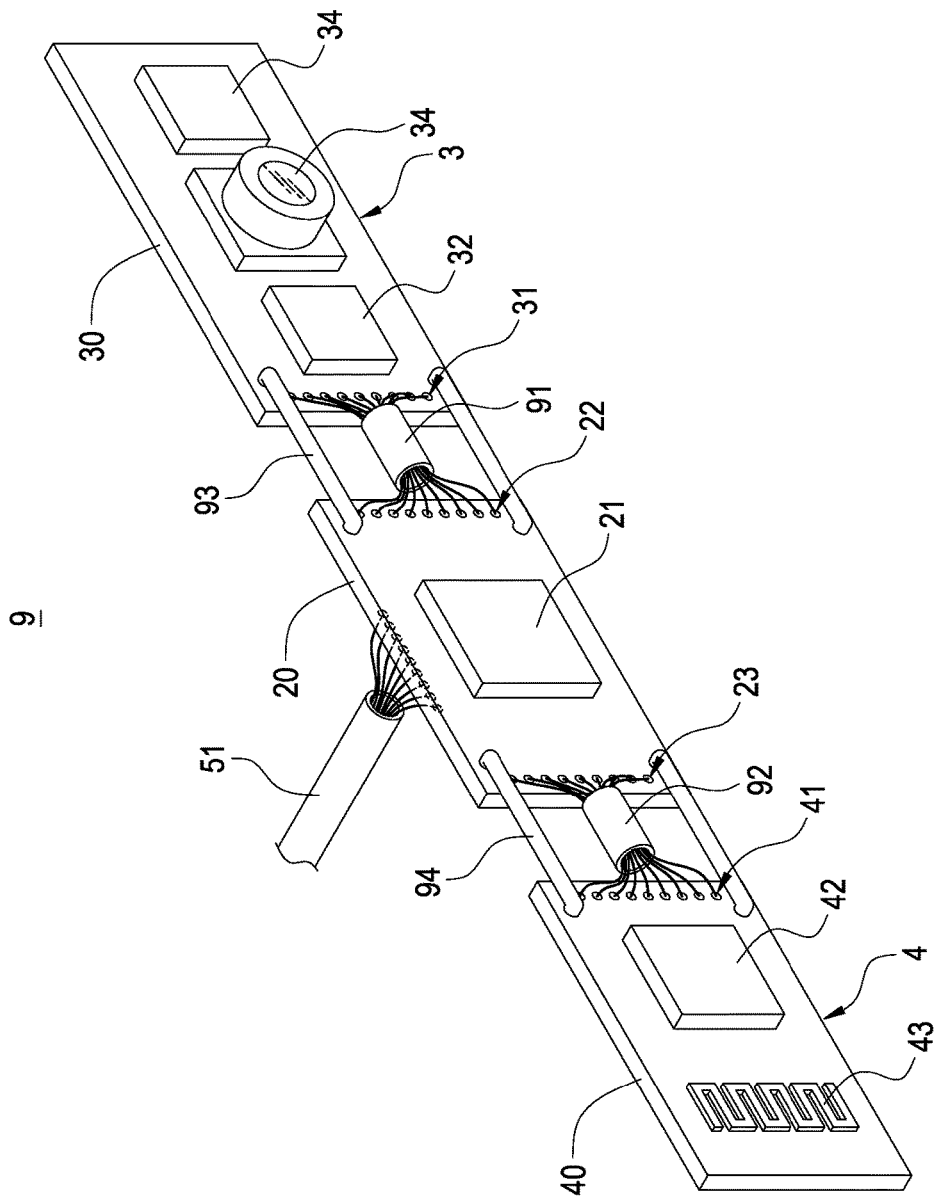
FIG. 6 shows an assembly drawing of the fifth embodiment of the present invention.

FIG. 6 shows an assembly drawing of the fifth embodiment of the present invention. FIG. 6 discloses a fifth type of the wireless transmission and video integrated apparatus 9. The first expansion interface 22 of the wireless transmission and video integrated apparatus 9 is a plurality of connection points on the hub circuit board 20. The second expansion interface 23 of the wireless transmission and video integrated apparatus 9 is a plurality of connection points on the hub circuit board 20 as well.

The first connection interface 31 of the wireless transmission and video integrated apparatus 9 is a plurality of connection points on the first circuit board 30. The quantity of the connection points belonging to the first connection interface 31 matches the quantity of the connection points belonging to the first expansion interface 22. The wireless transmission and video integrated apparatus 9 further comprises a first connection wire 91. One side of the first connection wire 91 is electrically connected to (for example, by welding) the first connection interface 31. The other side of the first connection wire 91 is electrically connected to (for example, by welding) the first expansion interface 22. Therefore, the video module 3 is connected to the hub module 2 through the first connection wire 91.

The second connection interface 41 of the wireless transmission and video integrated apparatus 9 is a plurality of connection points on the second circuit board 40. The quantity of the connection points belonging to the second connection interface 41 matches the quantity of the connection points belonging to the second expansion interface 23. The wireless transmission and video integrated apparatus 9 further comprises a second connection wire 92. One side of the second connection wire 92 is electrically connected to (for example, by welding) the second connection interface 41. The other side of the second connection wire 92 is electrically connected to (for example, by welding) the second expansion interface 23. Therefore, the wireless module 4 is connected to the hub module 2 through the second connection wire 92.

Moreover, the wireless transmission and video integrated apparatus 9 further comprises at lease a first fixing part 93. One side of the first fixing part 93 is fixed at one side of the hub circuit board 20. The other side of the first fixing part 93 is fixed at one side of the first circuit board 30. Moreover, the wireless transmission and video integrated apparatus 9 further comprises at lease a second fixing part 94. One side of the second fixing part 94 is fixed at another side of the hub circuit board 20 away from the first fixing part 93. The other side of the second fixing part 94 is fixed at one side of the second circuit board 40. Therefore, the hub module 2, the video module 3 and the wireless module 4 are fixed together and are not waggled. Assembling the wireless transmission and video integrated apparatus 9 is fast. Moreover, the first fixing part 93 and the second fixing part 94 can be arranged in the wireless transmission and video integrated apparatus 7, the wireless transmission and video integrated apparatus 7' or the wireless transmission and video integrated apparatus 8 mentioned above as well. The blocking element 10 which provides protecting from electromagnetic interference (EMI) and is disclosed in FIG. 3B can be arranged in the wireless transmission and video integrated apparatus 7, the wireless transmission and video integrated apparatus 7', the wireless transmission and video integrated apparatus 8 or the wireless transmission and video integrated apparatus 9 mentioned above as well.

Figure 7:
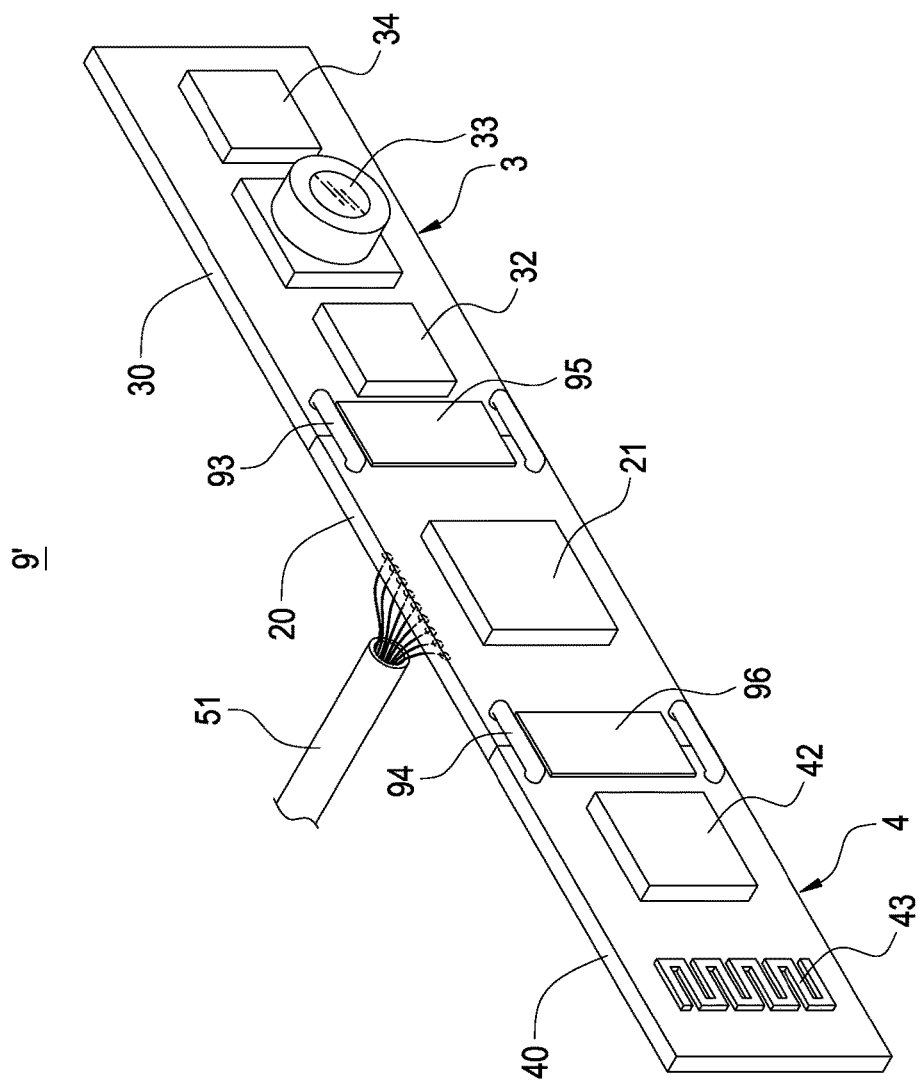
FIG. 7 shows an assembly drawing of the sixth embodiment of the present invention.

FIG. 7 shows an assembly drawing of the sixth embodiment of the present invention. FIG. 7 discloses a sixth type of the wireless transmission and video integrated apparatus 9' which is similar to the wireless transmission and video integrated apparatus 9 shown in FIG. 6. The first expansion interface 22, the second expansion interface 23, the first connection interface 31 and the second connection interface 41 of the wireless transmission and video integrated apparatus 9' are connection points on the circuit board as well. Moreover, the wireless transmission and video integrated apparatus 9' further comprises a first thin film circuit board 95 and a second thin film circuit board 96.

Connection circuits are printed on the first thin film circuit board 95. The first thin film circuit board 95 is pasted on the first connection interface 31 of the video module 3 and on the first expansion interface 22 of the hub module 2. Therefore, the first connection interface 31 is electrically connected to the first expansion interface 22 through the connection circuits printed on the first thin film circuit board 95. Furthermore, the video module 3 is connected to the hub module 2.

Connection circuits are printed on the second thin film circuit board 96 as well. The second thin film circuit board 96 is pasted on the second connection interface 41 of the wireless module 4 and on the second expansion interface 23 of the hub module 2. Therefore, the second connection interface 41 is electrically connected to the second expansion interface 23 through the connection circuits printed on the second thin film circuit board 96. Furthermore, the wireless module 4 is connected to the hub module 2.

The first fixing part 93 and the second fixing part 94 mentioned above can be arranged on the hub module 2, the video module 3 and the wireless module 4 of the wireless transmission and video integrated apparatus 9' as well. Therefore, the hub module 2, the video module 3 and the wireless module 4 are fixed together, so that assembling the wireless transmission and video integrated apparatus 9' is fast. Moreover, the blocking element 10 which is mentioned above and provides protecting from electromagnetic interference (EMI) can be arranged in the wireless transmission and video integrated apparatus 9' as well.

Figure 8:
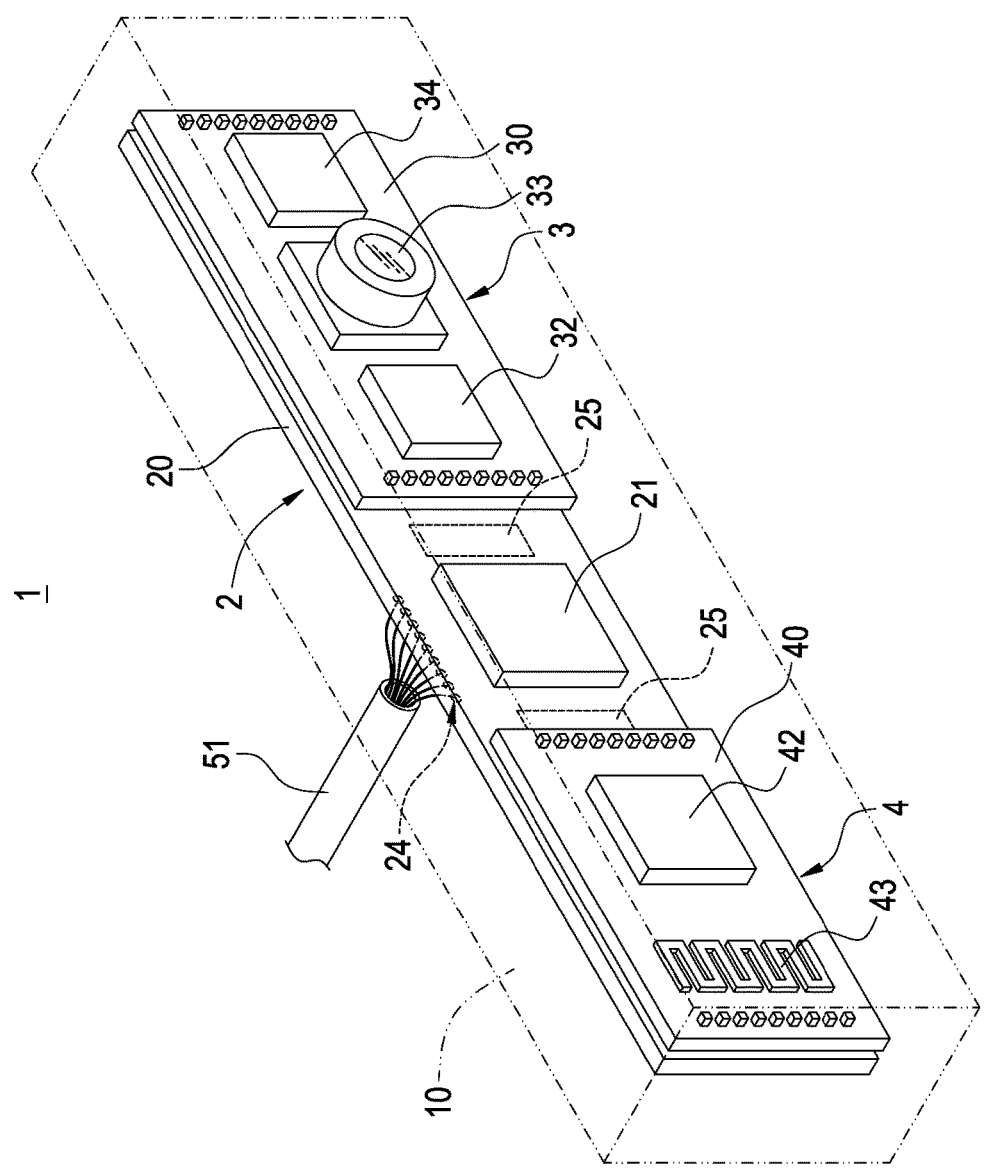
FIG. 8 shows an assembly drawing of the seventh embodiment of the present invention.

FIG. 8 shows an assembly drawing of the seventh embodiment of the present invention. In an embodiment of the present invention, the transmission interface 24 of the hub module 2 is a plurality of connection points in compliance with USB specifications or is a USB connector. The transmission line 51 is in compliance with USB specifications. Therefore, before the hub module 2 outputs the signals through the transmission interface 24, wherein the signals are received by the video module 3 and the wireless module 4, the format of the signals need to be converted into USB format.

As shown in FIG. 8, the wireless transmission and video integrated apparatus 1 further comprises a converting circuit 25 arranged on the hub circuit board 20. The converting circuit 25 is electrically connected to the hub unit 21, the first expansion interface 22 and the second expansion interface 23 through the hub circuit board 20. The converting circuit 25 converts the signals outputted from the video module 3 and the wireless module 4. For example, if the wireless module 4 of the wireless transmission and video integrated apparatus 1 is a Wi-Fi communication module, the format of the signal outputted from the wireless module 4 can be peripheral component interconnect express (PCI-E) format. Therefore, after the hub unit 21 receives the wireless signal outputted from the wireless module 4, the converting circuit 25 converts the format of the wireless signal into USB format to obtain a USB format signal, and then the USB format signal is sent out through the transmission interface 24.

For another example, if the wireless module 4 of the wireless transmission and video integrated apparatus 1 is a NFC communication module, the format of the signal outputted from the wireless module 4 can be secure digital input/output (SDIO) format. Therefore, after the hub unit 21 receives the wireless signal outputted from the wireless module 4, the converting circuit 25 converts the format of the wireless signal into USB format to obtain a USB format signal, and then the USB format signal is sent out through the transmission interface 24.

Going with the converting circuit 25, the hub module 2 can be expanded (connected) to any video module, wireless module or other function modules through the first expansion interface 22 and the second expansion interface 23.

Therefore, for the manufacturer, the electronic apparatus can be quickly assembled and the design is flexible for customers.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A wireless transmission and video integrated apparatus assembled to an electronic apparatus and electrically connected to a main board of the electronic apparatus, the wireless transmission and video integrated apparatus comprising:
   a video module having a first circuit board, an image acquisition unit, an image processing unit, a microphone unit and a first connection interface, the image acquisition unit electrically connected to the first circuit board and acquiring an image signal, the image processing unit electrically connected to the first circuit board and the image acquisition unit, the image processing unit processing the image signal with an analog-to-digital conversion, the microphone unit electrically connected to the first circuit board and acquiring an audio signal, the first connection interface electrically connected to the first circuit board, the image processing unit and the microphone unit, the first connection interface receiving and outputting the image signal and the audio signal;
   a wireless module having a second circuit board, an antenna unit, a wireless communication unit and a second connection interface, the antenna unit electrically connected to the second circuit board and transmitting a wireless signal, the wireless communication unit electrically connected to the second circuit board and the antenna unit, the wireless communication unit processing the wireless signal, the second connection interface electrically connected to second circuit board and the wireless communication unit, the second connection interface receiving and outputting the wireless signal; and
   a hub module having a hub circuit board, a first expansion interface, a second expansion interface, a hub unit and a transmission interface, the first expansion interface electrically connected to the hub circuit board and the first connection interface, the second expansion interface electrically connected to the hub circuit board and the second connection interface, the hub unit electrically connected to the hub circuit board, the first expansion interface and the second expansion interface, the transmission interface electrically connected to the hub circuit board and the hub unit, the transmission interface outputting the video signal, the audio signal and the wireless signal to the main board.

2. The wireless transmission and video integrated apparatus in claim 1, wherein the transmission interface is a plurality of connection points in compliance with universal serial bus specifications or is a universal serial bus connector; the transmission interface is electrically connected to a transmission line in compliance with the universal serial bus specifications; the transmission interface is electrically connected to the main board through the transmission line.

3. The wireless transmission and video integrated apparatus in claim 2, wherein the first expansion interface and the second expansion interface are a plurality of connection holes on the hub circuit board; the first connection interface comprises a plurality of connection pins plugging into the first expansion interface; the second connection interface comprises a plurality of connection pins plugging into the second expansion interface.

4. The wireless transmission and video integrated apparatus in claim 2, wherein the first expansion interface and the second expansion interface are butting connectors arranged on the hub circuit board; connection ports of the first expansion interface and the second expansion interface are arranged vertically on an upper side of the hub circuit board; the first connection interface is a butting connector arranged vertically on the first circuit board, and a connection port of the first connection interface is arranged vertically on a lower side of the first circuit board to be vertically connected to the first expansion interface; the second connection interface is a butting connector arranged vertically on the second circuit board, and a connection port of the second connection interface is arranged vertically on a lower side of the second circuit board to be vertically connected to the second expansion interface.

5. The wireless transmission and video integrated apparatus in claim 2, wherein the first expansion interface and the second expansion interface are butting connectors arranged on the hub circuit board; connection ports of the first expansion interface and the second expansion interface are arranged horizontally on the hub circuit board; the first connection interface is a butting connector arranged on the first circuit board, and a connection port of the first connection interface is arranged horizontally on the first circuit board to be horizontally connected to the first expansion interface; the second connection interface is a butting connector arranged on the second circuit board, and a connection port of the second connection interface is arranged horizontally on the second circuit board to be horizontally connected to the second expansion interface.

6. The wireless transmission and video integrated apparatus in claim 2, wherein the first expansion interface and the second expansion interface are a plurality of connection points on the hub circuit board; the first connection interface is a plurality of connection points on the first circuit board; the second connection interface is a plurality of connection points on the second circuit board; the wireless transmission and video integrated apparatus further comprises a first connection wire and a second connection wire; one side of the first connection wire is electrically connected to the first connection interface; the other side of the first connection wire is electrically connected to the first expansion interface; one side of the second connection wire is electrically connected to the second connection interface; the other side of the second connection wire is electrically connected to the second expansion interface.

7. The wireless transmission and video integrated apparatus in claim 2, wherein the first expansion interface and the second expansion interface are a plurality of connection points on the hub circuit board; the first connection interface is a plurality of connection points on the first circuit board; the second connection interface is a plurality of connection points on the second circuit board; the wireless transmission and video integrated apparatus further comprises a first thin film circuit board and a second thin film circuit board; connection circuits are printed on the first thin film circuit board and the second thin film circuit board; the first thin film circuit board is pasted on the first connection interface and the first expansion interface; the second thin film circuit board is pasted on the second connection interface and the second expansion interface.

8. The wireless transmission and video integrated apparatus in claim 2, wherein the first expansion interface and the second expansion interface are arranged on the hub circuit board and are row needles or row needle sockets; the first connection interface is arranged on the first circuit board and is row needles or row needle sockets; the second connection interface is arranged on the second circuit board and is row needles or row needle sockets; the wireless transmission and video integrated apparatus further comprises a first cable and a second cable; row needle sockets or row needles at one side of the first cable are plugged by or plugs into the first connection interface; row needle sockets or row needles at the other side of the first cable are plugged by or plugs into the first expansion interface; row needle sockets or row needles at one side of the second cable are plugged by or plugs into the second connection interface; row needle sockets or row needles at the other side of the second cable are plugged by or plugs into the second expansion interface.

9. The wireless transmission and video integrated apparatus in claim 5, further comprising a first fixing part and a second fixing part; one side of the first fixing part is fixed at one side of the hub circuit board; the other side of the first fixing part is fixed at one side of the first circuit board; one side of the second fixing part is fixed at another side of the hub circuit board away from the first fixing part; the other side of the second fixing part is fixed at one side of the second circuit board.

10. The wireless transmission and video integrated apparatus in claim 6, further comprising a first fixing part and a second fixing part; one side of the first fixing part is fixed at one side of the hub circuit board; the other side of the first fixing part is fixed at one side of the first circuit board; one side of the second fixing part is fixed at another side of the hub circuit board away from the first fixing part; the other side of the second fixing part is fixed at one side of the second circuit board.

11. The wireless transmission and video integrated apparatus in claim 7, further comprising a first fixing part and a second fixing part; one side of the first fixing part is fixed at one side of the hub circuit board; the other side of the first fixing part is fixed at one side of the first circuit board; one side of the second fixing part is fixed at another side of the hub circuit board away from the first fixing part; the other side of the second fixing part is fixed at one side of the second circuit board.

12. The wireless transmission and video integrated apparatus in claim 8, further comprising a first fixing part and a second fixing part; one side of the first fixing part is fixed at one side of the hub circuit board; the other side of the first fixing part is fixed at one side of the first circuit board; one side of the second fixing part is fixed at another side of the hub circuit board away from the first fixing part; the other side of the second fixing part is fixed at one side of the second circuit board.

13. The wireless transmission and video integrated apparatus in claim 2, further comprising a converting circuit electrically connected to the hub circuit board; the converting circuit is electrically connected to the hub unit, the first expansion interface and the second expansion interface through the hub circuit board; the converting circuit converts signals outputted from the video module and the wireless module.

* * * * *